(12) United States Patent
van den Berg et al.

(10) Patent No.: US 8,502,317 B2
(45) Date of Patent: Aug. 6, 2013

(54) LEVEL SHIFTER CIRCUITS FOR INTEGRATED CIRCUITS

(76) Inventors: Leendert Jan van den Berg, Edmonton (CA); Duncan George Elliott, Edmonton (CA)

( * ) Notice: Subject to any disclaimer, the term of this patent is extended or adjusted under 35 U.S.C. 154(b) by 746 days.

(21) Appl. No.: 12/701,583

(22) Filed: Feb. 7, 2010

(65) Prior Publication Data

US 2010/0201427 A1 Aug. 12, 2010

Related U.S. Application Data

(60) Provisional application No. 61/150,416, filed on Feb. 6, 2009.

(51) Int. Cl.
*H01L 27/092* (2006.01)
*H03L 5/00* (2006.01)
(52) U.S. Cl.
USPC ............... 257/357; 257/E27.062; 257/354; 257/355; 327/333

(58) Field of Classification Search
USPC ............... 327/333; 257/357, E27.062
See application file for complete search history.

(56) References Cited

U.S. PATENT DOCUMENTS

2009/0161725 A1* 6/2009 Floyd ............... 374/163
2012/0046007 A1* 2/2012 Rafi ............... 455/209

* cited by examiner

*Primary Examiner* — Mamadou Diallo

(57) ABSTRACT

A level shifter circuit for integrated circuits has one or more inputs that operate in a first voltage domain, and a signal output that operates in a second voltage domain. In some embodiments, the level shifter circuit receives two complementary input signals. The level shifter uses cross-coupled PMOS transistors with drain-bulk breakdown voltage less than the gate-oxide breakdown voltage of high-voltage PMOS transistors to prevent gate-oxide breakdown caused by sub-threshold leakage of auxiliary high-voltage PMOS transistors in the off state. Permanent gate-oxide breakdown is prevented through non-permanent sub-nanoamp drain-bulk junction breakdown. The level shifter circuit has the advantages of small circuit size and low static power consumption.

12 Claims, 2 Drawing Sheets

LEVEL SHIFTER CIRCUITS FOR INTEGRATED CIRCUITS

CROSS-REFERENCE TO RELATED APPLICATIONS

This application claims the benefit, pursuant to 35 U.S.C. 119(e), of U.S. Provisional Application No. 61/150,416 filed Feb. 6, 2009, which is hereby incorporated by reference in its entirety for continuity of disclosure.

FIELD OF THE INVENTION

The present invention relates in general to integrated circuits (ICs) employing multiple voltage values and, in particular, to voltage level "interfaces" or level shifter circuits.

BACKGROUND OF THE INVENTION

Level-shifter circuits are known in the art. Integrated circuits use level-shifter circuits to bridge different voltage domains, in particular to change the voltage of a signal from a first voltage to a second voltage. For instance, low-voltage (LV) digital and mixed signal circuits are often combined with high-voltage (HV) driving capabilities for MEMS (micro-electromechanical systems) applications. The driving circuits often use a HV NMOS (high-voltage n-type metal-oxide semiconductor) and a HV PMOS (high-voltage p-type metal-oxide semiconductor) as the pull-up and pull-down device, respectively. While the HV NMOS can be controlled using standard LV logic, an appropriate HV control signal must be applied to the gate of the HV PMOS for proper operation. Level-shifter circuits are used to generate the appropriate HV signals to control the HV PMOS.

Insulated gate field effect transistors are conventionally referred to as MOSFETs or MOS, regardless of whether the gate is constructed of metal or the gate insulator is constructed of silicon-dioxide. Low-voltage MOSFETs have conventional sources and drains. IC process options may be available (including gate insulator thickness and material) to give differences in operating voltage, although such variations will be collectively referred to herein as LV MOS or simply NMOS and PMOS. Double-diffused MOS (DMOS) is a common construction for high-voltage transistors. Variant constructions include laterally-diffused MOS (LDMOS) and extended-drain PMOS (EDPMOS).

As will be discussed in greater detail later herein, prior art level shifter circuits are susceptible to gate-oxide breakdown resulting from transistor sub-threshold leakage unless input signals are toggled or refreshed at sufficient intervals. In view of this problem, there is a need for a high-voltage level shifter circuit with low static power consumption that does not require refreshing or additional pull-up elements. The present invention is directed to this need.

BRIEF SUMMARY OF THE INVENTION

In accordance with the present invention, a level shifter circuit is implemented with six transistors. The cross-coupled transistors comprise a first PMOS transistor and a second PMOS transistor, each having its source tied to the second voltage and its gate tied to the drain of the other PMOS transistor. The drain of the first PMOS transistor is tied to the source of a first HV PMOS transistor and the drain of the second PMOS transistor is tied to the source of a second HV PMOS transistor. The gates of the first and second HV PMOS transistors are connected to a bias voltage. The drain of the first HV PMOS transistor is tied to the drain of a first HV NMOS transistor and the drain of the second HV PMOS transistor is tied to the drain of a second HV NMOS transistor. The source of both of these HV NMOS transistors is connected to GND. From the input unit, an input signal is connected to the gate of the first HV NMOS transistor and the complementary input signal is connected to the gate of the second HV NMOS transistor. The node connecting the drain of the first PMOS transistor and the source of the first HV PMOS transistor is connected to an output unit. The first and second PMOS transistors are used as protection transistors. The PMOS transistors and the HV PMOS transistor of the output unit are protected from gate-oxide breakdown through non-permanent drain-bulk junction breakdown of the first and second PMOS transistors, which would otherwise be caused by sub-threshold leakage in the first and second HV PMOS transistors.

Accordingly, in a first aspect the present invention provides a level shifter circuit for converting a first input signal in the voltage domain of a first power supply into an output signal in the voltage domain of a second power supply, comprising: a first PMOS transistor, with a source coupled to the second power supply and a gate connected to a complementary output node; a second PMOS transistor, with a source coupled to the second power supply and a gate coupled to the output node; a first HV PMOS transistor, with a source coupled to the output node and a gate coupled to a bias voltage; a second HV PMOS transistor, with a source coupled to complementary output node and a gate coupled to a bias voltage; a first HV NMOS transistor, with a drain coupled to the drain of the first HV PMOS transistor, a gate coupled to the first input signal, and source coupled to a ground terminal; and a second HV NMOS transistor, with a drain coupled to the drain of the second HV PMOS transistor, a gate coupled to the complement of the first input signal, and source coupled to the ground terminal.

In alternative embodiments, the first PMOS transistor and second PMOS transistor can be used as protection transistors, and the first and second PMOS transistors are protected from gate-oxide breakdown caused by sub-threshold leakage in the first HV PMOS transistor and second HV PMOS transistor, by non-permanent drain-bulk junction breakdown of the first and second HV PMOS transistors.

In alternative embodiments, the bias voltage can be set at any voltage greater than the voltage of the second power supply less the gate-oxide breakdown voltage of the protection transistors.

In one alternative embodiment, the high-voltage transistors are DMOS. In another alternative embodiment, the HV PMOS transistors are EDPMOS and the HV NMOS transistors are LDMOS.

Level shifter circuits in accordance with the invention may comprise an output unit powered by the second power supply, with the output unit being coupled to a second input signal, and being adapted to generate:

the output signal if the first input signal is logic high and the second input signal is logic low;
the complementary output signal if the first signal input is logic low and the second input signal is logic high;
a high-impedance output signal if the first and second input signals are logic low; and
an undefined state if the first and second input signals are logic high.

In variants of this embodiment, the output unit may comprise: a third HV PMOS transistor having a source coupled to the second power supply, a gate coupled to the output node, and a drain coupled to the output unit output; and a third HV NMOS transistor having a drain coupled to the output unit output, a gate coupled to the second input signal, and a source coupled to the ground terminal.

In an alternative embodiment, the level shifter circuit may comprise an output unit powered by the second power supply, with the output unit being coupled to the complementary output of the first input signal, and being adapted to generate the output signal if the first input signal is logic high, and to generate the complementary output signal if the first input signal is logic low. In variants of this embodiment, the output unit may comprise: a third HV PMOS transistor having a source coupled to the second power supply, a gate coupled to the output node, and a drain coupled to the output unit output; and a third HV NMOS transistor having a drain coupled to the output unit output, a gate coupled to the complementary output of the first input signal, and a source coupled to the ground terminal.

In a second aspect, the present invention provides a MOSFET gate oxide overvoltage protection circuit comprising a first MOSFET requiring protection against a gate overvoltage condition from other circuit components; and a second MOSFET with drain coupled to the gate of the first MOSFET. In one embodiment of the MOSFET gate oxide overvoltage protection circuit, the second MOSFET has a doping profile whereby it exhibits drain-to-bulk breakdown at a lower voltage than the gate breakdown voltage of the first MOSFET. In a second embodiment, the second MOSFET has a doping profile and a channel length whereby it exhibits drain-to-source breakdown at a lower voltage than the gate breakdown voltage of the first MOSFET.

BRIEF DESCRIPTION OF THE DRAWINGS

Embodiments of the invention will now be described with reference to the accompanying figures, in which numerical references denote like parts, and in which.

DETAILED DESCRIPTION OF THE PREFERRED EMBODIMENTS

As used in this patent document, the word "logic low" in reference to an input signal is to be understood as meaning having a voltage level GND. As used in this patent document, the word "logic high" in reference to an input signal is to be understood as meaning having a voltage level of the first power supply VDDL.

Figure 1:
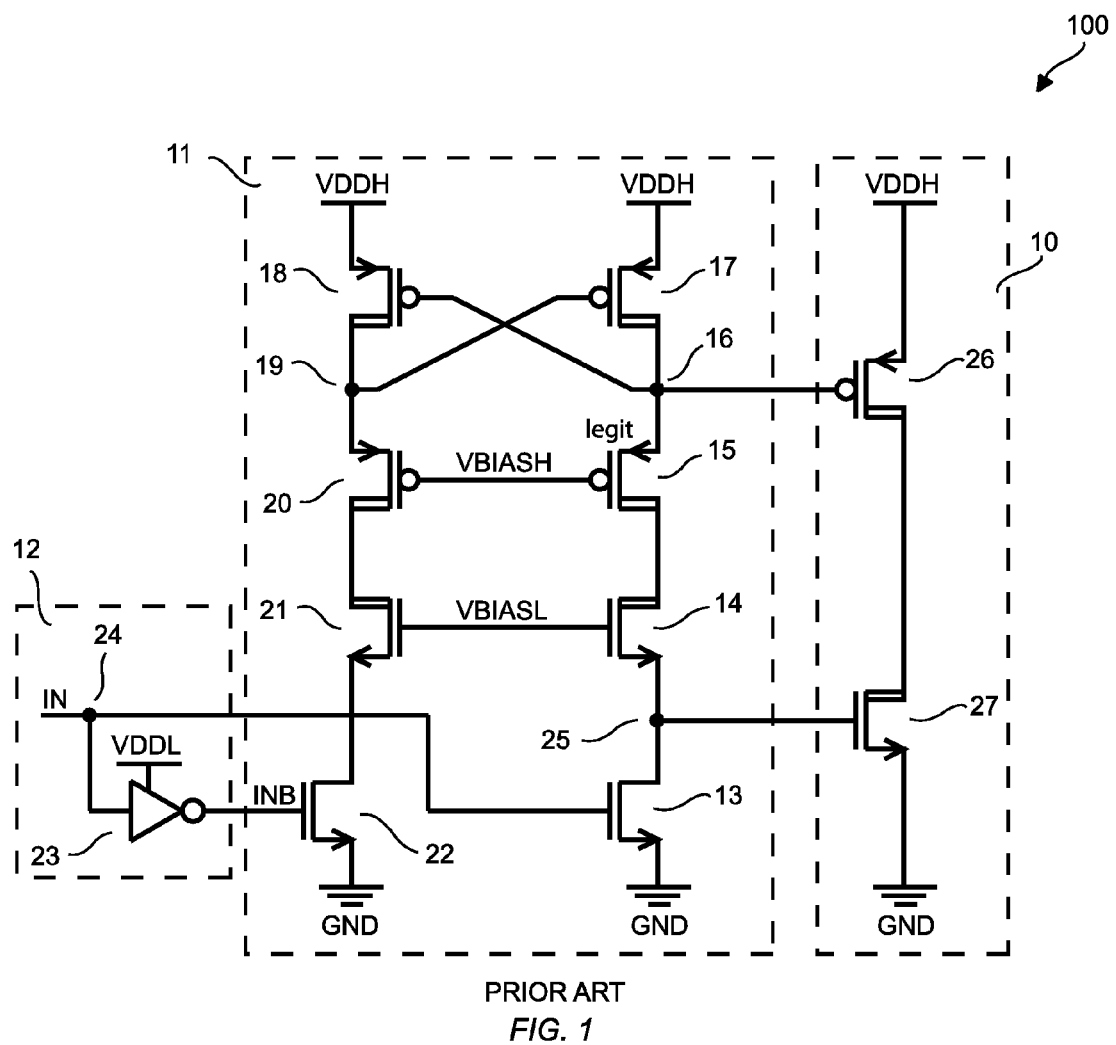
FIG. 1 is a schematic diagram of an output circuit incorporating a prior-art level shifter circuit.

FIG. 1 is a circuit diagram of an output circuit 100 incorporating a prior art level shifter circuit. Output circuit 100 includes an input unit 12, a level shifter unit 11 and an output unit 10. The voltage level VDDL of a first power supply provided for the input unit 12 is lower than the voltage level VDDH of a second power supply provided for level shifter unit 11. Level shifter unit 11 includes four HV PMOS transistors 15, 17, 18, 20, two HV NMOS transistors 21 and 14, and two LV NMOS transistors 22 and 13. Output unit 10 includes one HV PMOS transistor 26 and one HV NMOS transistor 27. In this prior art circuit, HV MOS transistor 26 is different from LV MOS transistor 27 in that HV MOS transistor 26 withstands higher source-drain breakdown or gate-oxide breakdown voltage than that of LV MOS transistor 26 (for example, a source-drain breakdown voltage of 300V and a gate-oxide breakdown voltage of 30V). The threshold voltage $V_T$ of the HV MOS transistor 26 is also higher than that of the LV MOS transistor 27. For example, in one variant the threshold voltage of HV PMOS transistor 26 is 0.8V, and the threshold voltage of HV NMOS transistor 27 is 1.2V. Low-voltage transistors 13 and 22 receive input signal IN and the complementary input signal INB, respectively.

The source of HV transistor 21 is connected to the drain of LV transistor 22, and the source of HV transistor 14 is connected to drain of LV transistor 13. When input signal IN is logic high, LV transistor 13 is on and transistor 22 is off, pulling voltage node 25 to ground GND. The resulting gate-source voltage, from voltage node 25 at GND and a first bias voltage VBIASL, pull the drain voltage of transistor 14 to GND. Transistor 15 and a second bias voltage VBIASH keep node 16 lower than VBIASH+$|V_T|$ because if voltage node 16 is higher than VBIASH+$|V_T|$, transistor 15 will turn on and pull voltage node 16 down to VBIASH+$|V_T|$. Bias voltages VBIASH and VBIASL are used to limit the voltage swing of voltage nodes 25 and 16. VBIASL limits the voltage across the drain of LV transistors 13 and 22, and VBIASH limits the voltage across the gate-oxide of transistors 17, 18, and 26. As voltage node 16 drops in voltage, the cross-coupled design of transistors 17 and 18 rapidly turns transistor 17 off, aiding transistor 15 to pull voltage node 16 to VBIASH.

In the contrary case when input signal IN is logic low, voltage node 16 is pulled high and voltage node 25 is pulled above GND, turning transistor 27 on. Input signal IN must be toggled or refreshed at sufficient intervals; otherwise, sub-threshold leakage through transistors 15 or 20 will cause a voltage drop across voltages nodes 16 or 19 sufficient to cause gate-oxide breakdown voltage of transistors 18 and 26 or 17, respectively.

Figure 2:
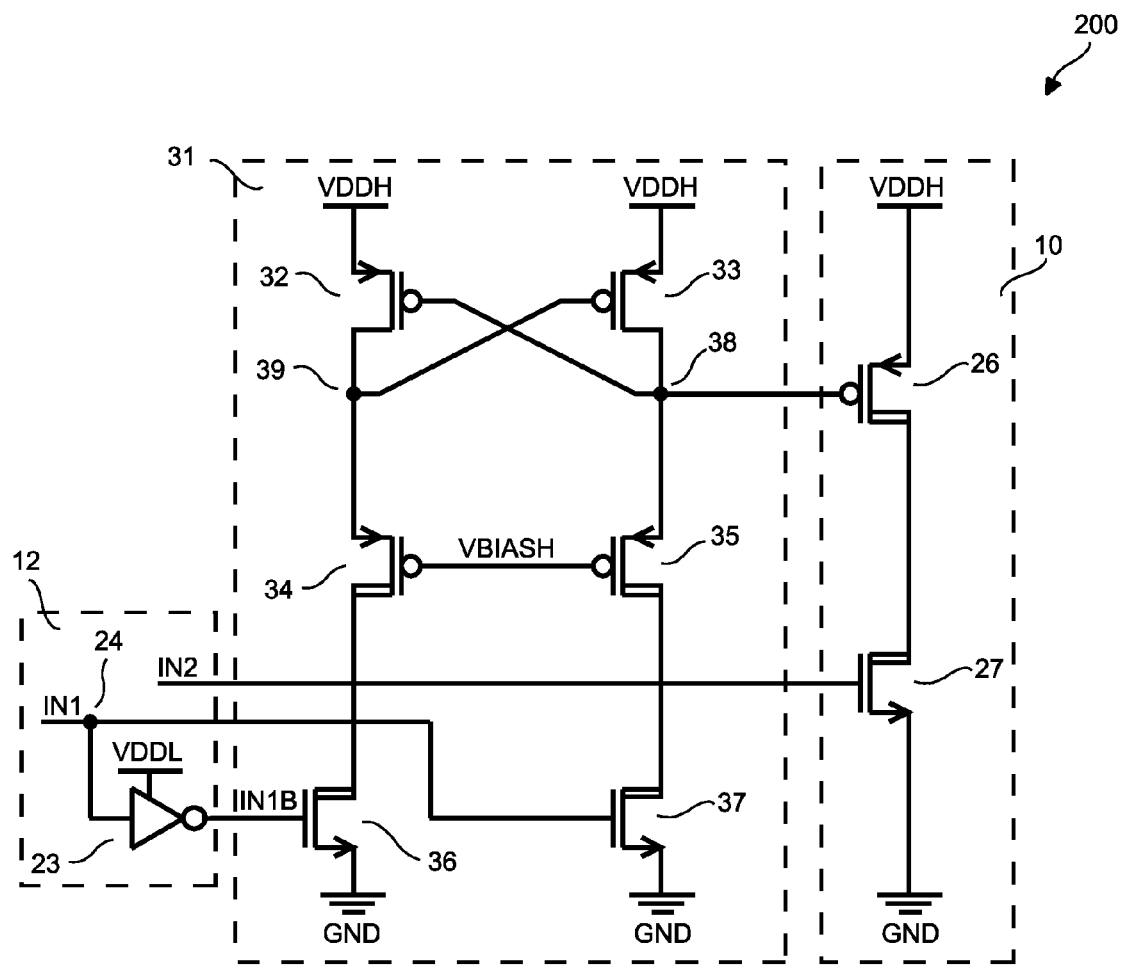
FIG. 2 is a schematic diagram of an output circuit incorporating a level shifter circuit in accordance with one embodiment of the present invention.

FIG. 2 is a schematic diagram of an output circuit 200 with the level shifter unit in accordance with one embodiment of the present invention. Output circuit 200 includes an input unit 12, a level shifter unit 31, and an output unit 10. Input unit 12 is powered by a first power supply operating at a low-voltage VDDL. Level shifter unit 31 and output unit 10 are powered by the second power supply operating at a high voltage, which voltage is higher than the voltage of the first power supply. The high voltage, which for purposes of this disclosure will be referred to as VDDH, may be supplied from an external supply or may be internally generated.

Input unit 12 includes an inverter 23. Inverter 23 receives a first input signal IN1 and generates a complementary input signal IN1B. Inverter 23 can be implemented by using a complementary transistor pair made up of an LV NMOS transistor and a LV PMOS transistor.

The level shifter unit includes a first PMOS transistor 33, a second PMOS transistor 32, a first HV PMOS transistor 35, a second HV PMOS transistor 34, and two HV NMOS transistors 36 and 37. The source of first PMOS transistor 33 and the source of second PMOS transistor 34 are connected to the high-voltage supply rail VDDH. The drain of first PMOS transistor 33 and the drain of second PMOS transistor 34 are connected to the source of first HV PMOS transistor 35 and the source of second HV PMOS transistor 34, respectively. First HV PMOS transistor 35 has its drain connected to the drain of first HV NMOS transistor 37, and second HV PMOS transistor 34 has its drain connected to the drain of second HV NMOS transistor 36. The sources of HV NMOS transistors 36 and 37 are connected to ground GND. The gates of PMOS transistors 32 and 33 are cross-coupled, meaning that the gate of PMOS transistor 32 is connected to the drain of PMOS transistor 33, and the gate of PMOS transistor 33 is connected to the drain of PMOS transistor 32. The gates of HV PMOS transistors 34 and 35 are connected to the bias voltage VBIASH, which may be supplied from an external supply or may be internally generated.

The gate of first HV NMOS transistor 37 is connected to first input signal IN1, and the gate of second HV NMOS transistor 36 is connected to the complementary input IN1B. The gate of HV NMOS transistor 27 of output unit 10 is connected to a second input signal IN2.

When second input signal IN2 is logic low and first input signal IN1 is logic high, HV NMOS transistors 36 and 27 are off and HV NMOS transistor 37 is on. This pulls voltage node 38 down to VBIASH+|$V_T$|. If voltage node 38 is higher than VBIASH+|$V_T$|, transistor 35 will turn on and pull voltage node 38 down to VBIASH+|$V_T$|. Sub-threshold leakage of transistor 35 gradually lowers the voltage at node 38.

By replacing HV PMOS transistors 18 and 17 with low-voltage PMOS transistors 32 and 33 with a drain-source breakdown voltage less than the gate-oxide breakdown voltage, gate-oxide breakdown of the transistors 32, 26, and 33 due to sub-threshold leakage in transistors 35 and 34 is prevented by typically sub-nanoamp drain-bulk junction (non-permanent) breakdown of transistors 33 and 32, respectively. This drain-bulk breakdown sources current to compensate for sub-threshold leakage in transistors 34 and 35, thus protecting the gates of transistors 32, 33, and 26 from breakdown, which would otherwise cause permanent failure. In alternative embodiments, a resistive voltage divider can be used to provide bias voltage VBIASH connected to the gates of transistors 34 and 35.

It will be readily appreciated by those skilled in the art that various modifications of the present invention may be devised without departing from the essential concept of the invention, and all such modifications are intended to come within the scope of the present invention and the claims appended hereto. It is to be especially understood that the invention is not intended to be limited to illustrated embodiments, and that the substitution of a variant of a claimed element or feature, without any substantial resultant change in the working of the invention, will not constitute a departure from the scope of the invention.

In this patent document, any form of the word "comprise" is to be understood in its non-limiting sense to mean that any item following such word is included, but items not specifically mentioned are not excluded. A reference to an element by the indefinite article "a" does not exclude the possibility that more than one of the element is present, unless the context clearly requires that there be one and only one such element. Any use of any form of the terms "connect", "engage", "couple", "attach", or any other term describing an interaction between elements is not meant to limit the interaction to direct interaction between the subject elements, and may also include indirect interaction between the elements such as through secondary or intermediary structure.

What is claimed is:

1. A level shifter circuit for converting a first input signal in the voltage domain of a first power supply into an output signal in the voltage domain of a second power supply, comprising:
   (a) a first PMOS transistor, with a source coupled to the second power supply and a gate connected to a complementary output node;
   (b) a second PMOS transistor, with a source coupled to the second power supply and a gate coupled to the output node;
   (c) a first HV PMOS transistor, with a source coupled to the output node and a gate coupled to a bias voltage;
   (d) a second HV PMOS transistor, with a source coupled to complementary output node and a gate coupled to a bias voltage;
   (e) a first HV NMOS transistor, with a drain coupled to the drain of the first HV PMOS transistor, a gate coupled to the first input signal, and source coupled to a ground terminal; and
   (f) a second HV NMOS transistor, with a drain coupled to the drain of the second HV PMOS transistor, a gate coupled to the complement of the first input signal, and source coupled to the ground terminal.

2. The level shifter circuit of claim 1, wherein:
   (a) the first PMOS transistor and second PMOS transistor can be used as protection transistors, and
   (b) said first and second PMOS transistors are protected from gate-oxide breakdown caused by sub-threshold leakage in the first HV PMOS transistor and second HV PMOS transistor, by non-permanent drain-bulk junction breakdown of said first and second HV PMOS transistors.

3. The level shifter circuit of claim 1, wherein the bias voltage can be set at any voltage greater than the voltage of the second power supply less the gate-oxide breakdown voltage of the protection transistors.

4. The level shifter circuit of claim 1 wherein the high-voltage transistors are DMOS.

5. The level shifter circuit of claim 1 wherein the HV PMOS transistors are EDPMOS and the HV NMOS transistors are LDMOS.

6. The level shifter circuit of claim 1, further comprising an output unit powered by the second power supply, said output unit being coupled to a second input signal, and being adapted to generate:
   (a) the output signal if the first input signal is logic high and the second input signal is logic low;
   (b) the complementary output signal if the first signal input is logic low and the second input signal is logic high;
   (c) a high-impedance output signal if the first and second input signals are logic low; and
   (d) an undefined state if the first and second input signals are logic high.

7. The level shifter circuit of claim 6, wherein the output unit comprises:
   (a) a third HV PMOS transistor having a source coupled to the second power supply, a gate coupled to the output node, and a drain coupled to the output unit output; and
   (b) a third HV NMOS transistor having a drain coupled to the output unit output, a gate coupled to the second input signal, and a source coupled to the ground terminal.

8. The level shifter circuit of claim 1, further comprising an output unit powered by the second power supply, said output unit being coupled to the complementary output of the first input signal, and being adapted to generate:
   (a) the output signal if the first input signal is logic high; and
   (b) the complementary output signal if the first input signal is logic low.

9. The level shifter circuit of claim 8, wherein the output unit comprises:
   (a) a third HV PMOS transistor having a source coupled to the second power supply, a gate coupled to the output node, and a drain coupled to the output unit output; and
   (b) a third HV NMOS transistor having a drain coupled to the output unit output, a gate coupled to the complementary output of the input signal, and a source coupled to the ground terminal.

10. A MOSFET gate oxide overvoltage protection circuit comprising:
  (a) a first MOSFET requiring protection against a gate overvoltage condition from other circuit components; and
  (b) a second MOSFET with drain coupled to the gate of the first MOSFET.

11. The MOSFET gate oxide overvoltage protection circuit of claim 10 wherein the second MOSFET has a doping profile whereby it exhibits drain-to-bulk breakdown at a lower voltage than the gate breakdown voltage of the first MOSFET.

12. The MOSFET gate oxide overvoltage protection circuit of claim 10 wherein the second MOSFET has a doping profile and a channel length whereby it exhibits drain-to-source breakdown at a lower voltage than the gate breakdown voltage of the first MOSFET.

* * * * *